United States Patent
Tolmachev et al.

(10) Patent No.: US 6,835,919 B2
(45) Date of Patent: Dec. 28, 2004

(54) INDUCTIVELY COUPLED PLASMA SYSTEM

(75) Inventors: Yuri Nikolaevich Tolmachev, Yongin (KR); Dong-joon Ma, Anyang (KR); Chang-wook Moon, Seoul (KR); Hea-young Yoon, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/259,393

(22) Filed: Sep. 30, 2002

(65) Prior Publication Data

US 2003/0111963 A1 Jun. 19, 2003

(30) Foreign Application Priority Data

Dec. 14, 2001 (KR) ........................................ 2001-79314

(51) Int. Cl.[7] ................................................ H05B 1/02
(52) U.S. Cl. ................................. 219/494; 156/345.37
(58) Field of Search .................... 315/111.01–111.91; 118/723 MW, 723 ME, 723 MA, 724, 723 R; 156/345.36, 345.37, 345 MT, 345 P, 345; 219/494

(56) References Cited

U.S. PATENT DOCUMENTS

| | | | | |
|---|---|---|---|---|
| 5,648,175 A | * | 7/1997 | Russell et al. ............ | 428/472.3 |
| 5,965,034 A | | 10/1999 | Vinogradov et al. .......... | 216/68 |
| 6,015,465 A | * | 1/2000 | Kholodenko et al. ....... | 118/719 |
| 6,184,158 B1 | | 2/2001 | Shufflebotham et al. .... | 438/788 |
| 6,200,893 B1 | | 3/2001 | Sneh ......................... | 438/685 |
| 6,326,597 B1 | * | 12/2001 | Lubomirsky et al. ....... | 219/494 |
| 6,551,447 B1 | * | 4/2003 | Savas et al. ........... | 156/345.48 |

OTHER PUBLICATIONS

G.K. Vinogradov, Transmission line balanced inductive plasma sources, Plasma Sources Sci. Techn. 9 2000, 400–412.

G.R. Tynan, Neutral depletion and transport mechanisms in large–area high density plasma sources, J. Appl. Phys. 86 1999, 5356.

* cited by examiner

*Primary Examiner*—Wilson Lee
(74) *Attorney, Agent, or Firm*—Lee & Sterba, P.C.

(57) ABSTRACT

An inductively coupled plasma apparatus is provided, wherein the inductively coupled plasma apparatus includes a process chamber having a wafer susceptor on which a substrate is installed, a top plasma source chamber which is installed on the process chamber, a reactor, which is installed in the top plasma source chamber, having a channel through which a gas flows, wherein the reactor supplies plasma reaction products to the process chamber, an inductor, having two ends, is installed between the top plasma source chamber and the reactor and is wound around the reactor, an opening which is positioned within a circumferential space in which the inductor is installed between the reactor and the process chamber, and a shutter operable to open and close the opening. Thus, a uniform radial distribution of radicals emanating from a plasma source can be improved.

22 Claims, 4 Drawing Sheets

INDUCTIVELY COUPLED PLASMA SYSTEM

BACKGROUND OF THE INVENTION

1. Field of the Invention

The present invention relates to an inductively coupled plasma system used in Chemical Vapor Deposition (CVD).

2. Description of the Related Art

Plasma processing of semiconductor work pieces has several advantages, such as low process temperatures and high effectiveness. For example, deposition of $SiO_2$ can be performed at temperatures below 200° C. with a deposition rate of about 100–500 nm/min using an $O_2$ plasma source and $SiH_4$ gas. However, in order to perform deposition on large areas, such as on wafers having a diameter up to 300 mm (11.8 inches), with high uniformity of the coating, the plasma source must have very high productivity and form a plasma having a uniform flux. These requirements are satisfied by several kinds of High Density Plasma sources (HDP), which are available in the art.

Although historically the development of HDP started from Electron Cyclotron Resonance (ECR) plasma, most recent applications are based on Radio Frequency (RF) driven Inductive Coupled Plasma (ICP). ICP sources are simple in design, have a wide power and pressure window, and do not require auxiliary magnets for their operation. A flat spiral coil inductor is typically used for high efficiency for deposition and etching. Disadvantageously, there are some inherent drawbacks with this kind of ICP source. For example, RF power from a coil to a process chamber must be fed through a dielectric window, which is typically made of quartz. The thickness of this window must be sufficient to withstand atmospheric pressure. Typically, this thickness must be several centimeters, and for large-scale equipment, the window must be still thicker. Also, the vacuum side of the dielectric window suffers from sputtering due to high voltages on the coil along with significant capacitive coupling.

A helical resonator is a kind of ICP sources that operates under resonance conditions of a helical inductor coil. Resonance is achieved by adjusting the length L of an inductor wire to a wavelength $\lambda$ that is associated with a RF electromagnetic field exciting the discharge and is governed by the equation $L=(\lambda/4)*m$, where m is an integer. Different m values correspond to different modes of standing waves in the inductor. Whether ends of the coil are electrically grounded or floating (they may be either) determines the different boundary conditions for current and voltage waveform. An RF tap position is usually intermediate, i.e. situated between the coil ends. By varying the boundary conditions and the inductor wire length, the plasma source may be balanced for parasitic capacitive coupling effects. This plasma source has a cylindrical geometry and must have a dielectric enclosure-plasma-containing vessel. This vessel is usually a cylindrical quartz tube (reactor), which at the same time forms the sidewall of a source vacuum chamber.

Balancing of the inductor minimizes plasma potential relative to a grounded surface and hence sputtering of a reactor material. This kind of inductor shows very high effectiveness and radial uniformity when applied for dry etching under pressure of 1 Torr or higher. However, when the pressure is below 10 mTorr, HDP with cylindrical geometry may lose radial uniformity of gas flow due to an effect of ion pumping that leads to a depletion of neutral species in an axial region. This effect is more pronounced at low pressures and high density of plasma, i.e., high concentration of charged particles. The most significant changes in neutral uniformity can occur in large-area plasma sources.

In most applications using ICP sources, an inductor is located outside a vacuum chamber. However, positioning of the inductor outside the chamber has several disadvantages. One, it requires large, complex dielectric vacuum vessels for a helical inductor or large area dielectric ports in a case of a flat spiral inductor. Two, an external inductor is not compatible with an Ultra High Vacuum (UHV) design.

In addition, while it is desirable to have the surface area of a susceptor much smaller than the surface area of the grounded portion in order to control a negative bias voltage on a substrate without applying high RF power, the ratio of the conductive portion of the chamber to a wafer susceptor is typically too small. Further, scaling up of the system is difficult.

An HDP source can be used for a Radical-Assisted Sequential (RAS) CVD process. The idea of RASCVD is similar to Atomic Layer Deposition (ALD) in which two precursors are supplied time-divisionally to the substrate. RASCVD differs from ALD, however, in that one of the precursors is a radical but not a stable compound. This method results in a monolayer controllable deposition with perfect thickness uniformity. However, if one of the precursors, namely the stable compound, has a low sticking probability, this process is not very effective.

SUMMARY OF THE INVENTION

In an effort to solve the above-described problems, it is a feature of an embodiment of the present invention to provide a high-density plasma apparatus, which can form a uniform radial distribution of radicals emanating from a plasma source.

It is another feature of an embodiment of the present invention to provide a high-density plasma apparatus which is capable of eliminating sputtering of an inductor and preventing back streaming of gas products near the inductor.

Accordingly, to provide the above features, according to an embodiment of the present invention, there is provided an inductively coupled plasma apparatus preferably including a process chamber, a top plasma source chamber, a reactor, an inductor, an opening, and a shutter. The process chamber has a wafer susceptor on which a substrate is installed. The top plasma source chamber is preferably installed on the process chamber. The reactor, which is installed in the top plasma source chamber, preferably has a channel through which a gas flows and supplies plasma reaction products to the process chamber. The inductor, having two ends, is preferably installed between the top plasma source chamber and the reactor and is preferably wound around the reactor. The opening is preferably positioned within a circumferential space, in which the inductor is installed, between the reactor and the process chamber. The shutter is operable to open and close the opening.

Preferably, the reactor includes an inner cylinder, an outer cylinder, and an annular channel, wherein the outer cylinder surrounds the inner cylinder. The annular channel is positioned between the inner cylinder and the outer cylinder. It is preferable that a top of the annular channel is connected to a gas manifold outside the top plasma source chamber.

According to an embodiment of the present invention, a bottom of the inner cylinder preferably narrows so that a bottom of the annular channel between the inner cylinder and the outer cylinder is changed into a circular shape. Preferably, a gas distributing plate having a plurality of orifices is installed in the annular channel. More specifically, the gas distributing plate may include a plurality of gas distributing plates that are spaced apart from each other in the annular channel.

Preferably, the wafer susceptor is electrically floating and supported by a ceramic vacuum break in the process chamber.

It is also preferable that a purge inert gas is supplied to the circumferential space in which the inductor is installed. Additionally, it is preferable that a length of the inductor is equal to $m \times \frac{1}{4}$ wavelengths of an applied high frequency electromagnetic field, where m is an integer. It is preferable that high frequency power is supplied to a turn of the inductor between the ends of the inductor, and that the two ends of the inductor are either grounded or floating. Further, it is preferable that a high frequency electromagnetic field and low frequency electromagnetic field are pulsed (i.e., turned on and off) either periodically or according to a given sequence.

It is also preferable that a plurality of bipolar pulses of a DC voltage be applied to the substrate. Finally, it is preferable that the pulses of the electromagnetic field are synchronized with a series of discrete supplies of a first and a second gas, and whereby the first and the second gases are supplied sequentially to provide a modified radical-assisted sequential deposition process.

BRIEF DESCRIPTION OF THE DRAWINGS

The above features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2001-79314, filed Dec. 14, 2001, and entitled: "Inductively Coupled Plasma System," is incorporated by reference herein in its entirety.

Figure 1:
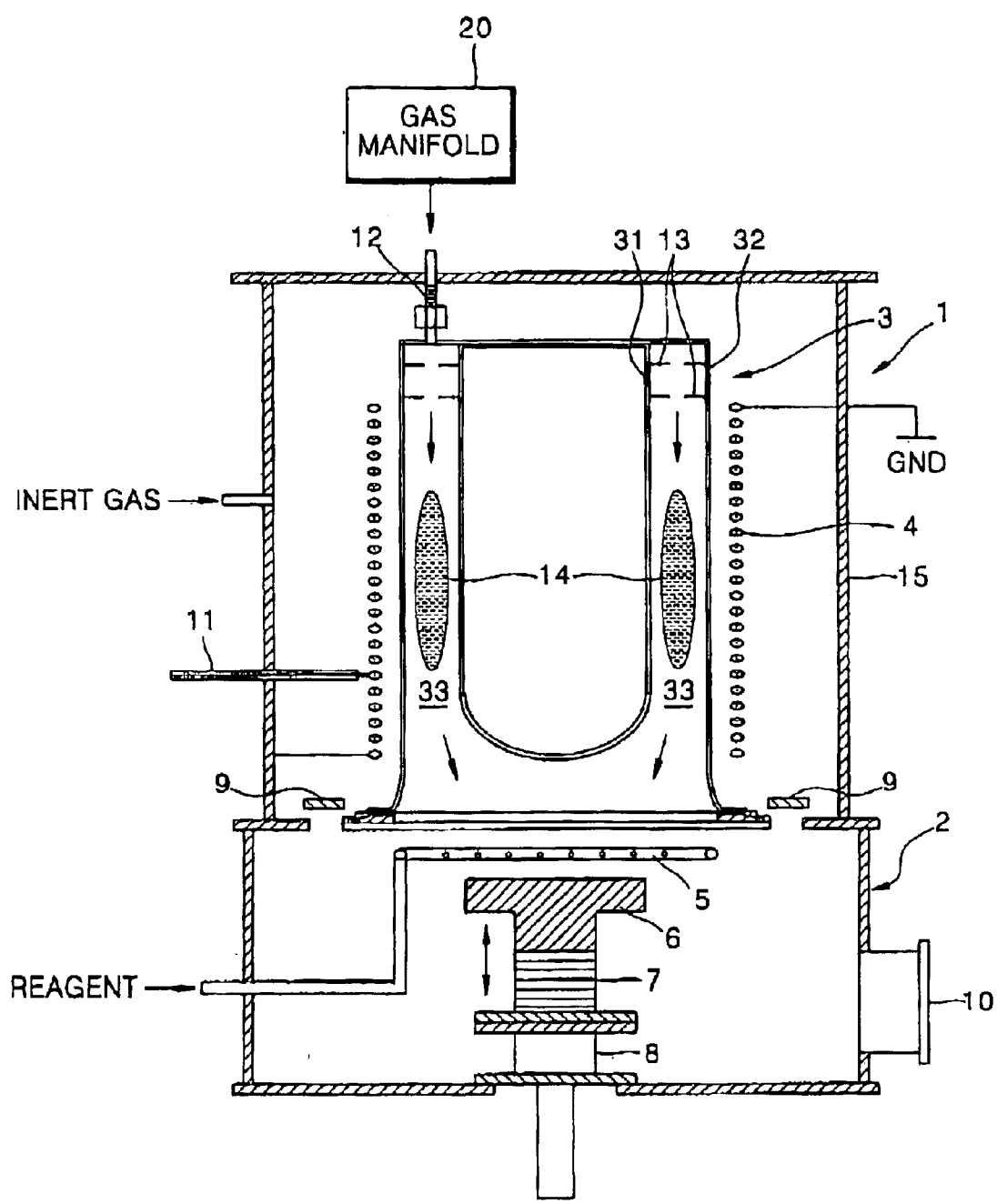
FIG. 1 illustrates a cross-sectional side view of an inductively coupled plasma (ICP) apparatus according to a preferred embodiment of the present invention.

FIG. 1 shows a cross-sectional side view of an inductively coupled plasma (ICP) apparatus according to a preferred embodiment of the present invention. The ICP apparatus includes a top plasma source chamber 1 and a process chamber 2.

A plasma source is positioned inside the top plasma source chamber 1. The plasma source includes a helical inductor coil 4 having two ends and a plasma reactor 3. The plasma reactor 3 is connected to a gas manifold 20 for supplying $O_2$, $N_2$, Ar, or the like by means of a nut and a bellows 12. An RF power source for exciting plasma in the plasma reactor 3 is applied to a turn of the inductor coil 4 via an RF cable 11 and an RF feed through (not shown). In this embodiment, the two ends of the inductor coil 4 are grounded, although in an alternate embodiment the two ends may be floating. The total length of the inductor coil 4 is equal to an integer number of $\frac{1}{4}$-wavelengths of an RF electromagnetic field. Under these conditions, a standing wave of voltage and current is formed in the inductor coil 4. It is preferable that the inductor coil 4 should have resonant length because, for large-scale systems, it is difficult to make an inductor wire short enough to eliminate current and voltage deviation along the inductor coil 4. Therefore, it is preferable to tune the length for resonance.

The purpose of the plasma source is to generate a first reagent flux of radicals while a gas or gas mixture chosen from the group of $O_2$, $N_2$, $C_2F_6$, Ar, He, and the like is passing through the plasma reactor 3.

The bottom end of the plasma reactor 3 is open, thus providing liquid flow communication of plasma products into the process chamber 2. A second reagent, in accordance with a remote plasma principle, is preferably supplied directly into the process chamber 2 without being subjected to decomposition into a plasma. This second reagent, e.g., $SiH_4$, being mixed with an inert gas is supplied through a gas injection ring 5 that has a number of orifices. The gas injection ring 5 provides an azimuthally uniform distribution of gas flow and prevents back streaming of reaction products into the gas manifold 20.

A substrate is preferably placed on a wafer susceptor, which further includes an assembly of a hot plate 6, a bellows 7, and a ceramic vacuum break 8. The hot plate 6 is preferably moveable to enable adjustment of the distance between the substrate and the gas injection ring 5 for better control of the radial uniformity of the coating. The ceramic vacuum break 8 insulates the wafer susceptor from the process chamber 2 in order to allow the substrate to have a floating potential. An exhaust port 10 is provided for exhausting reaction products.

Figure 2A:
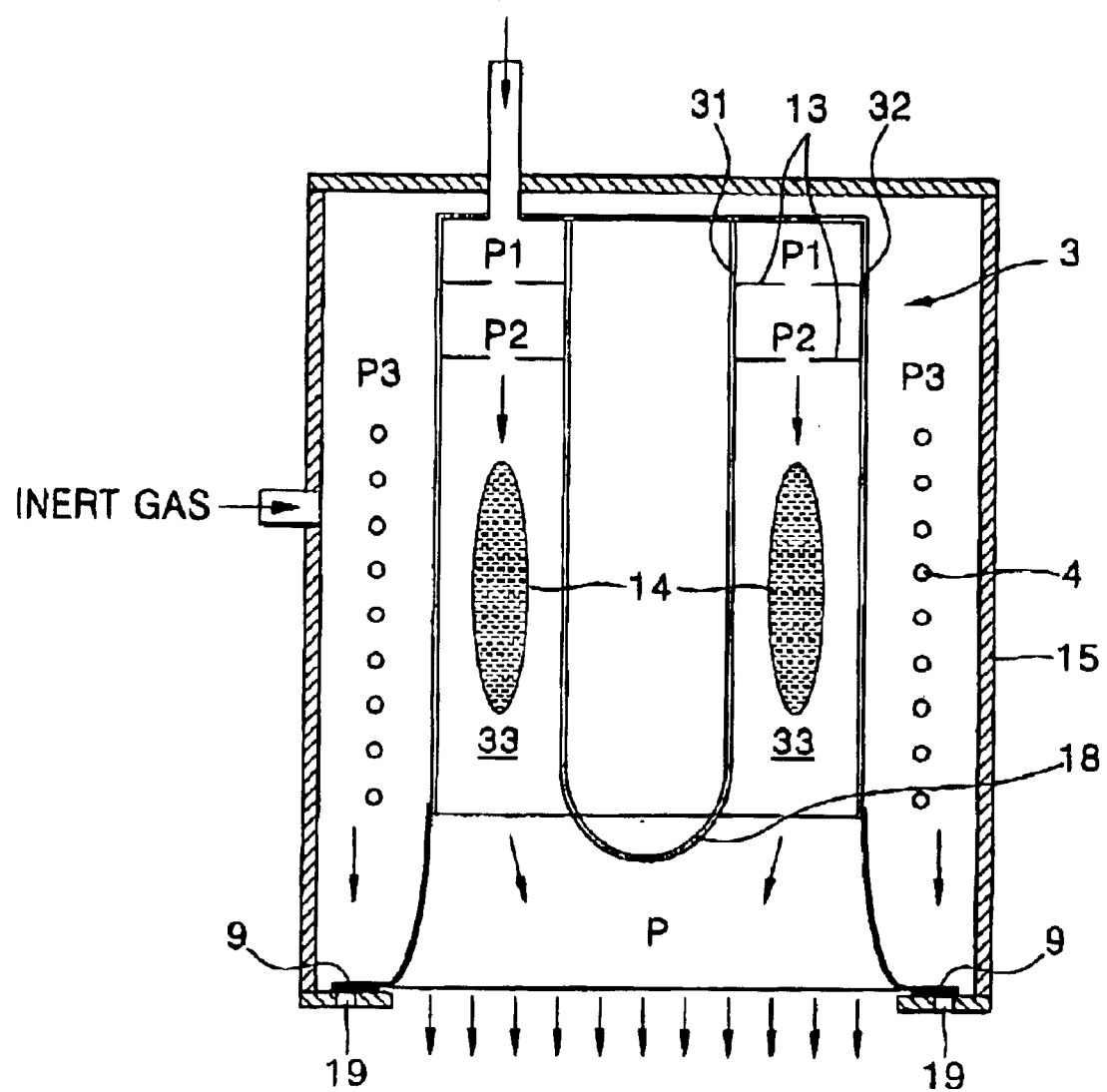
FIG. 2A illustrates a schematic view of a top plasma source chamber in the ICP apparatus shown in FIG. 1.
Figure 2B:
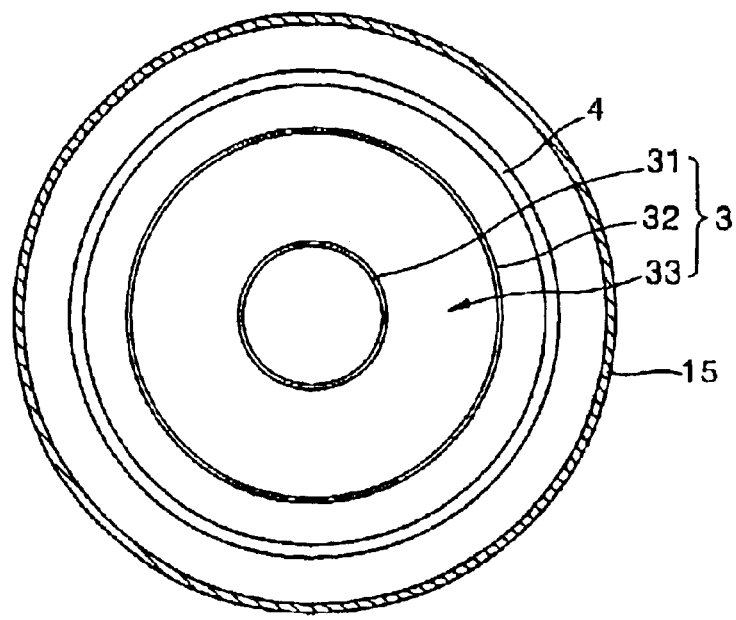
FIG. 2B illustrates a cross-sectional view of the top plasma source chamber in the ICP apparatus shown in FIG. 1.

The plasma reactor 3 preferably has an annular inner channel 33, which is shown in FIG. 2B. The plasma reactor 3 is preferably made of two dielectric cylinders 31 and 32 having different diameters. The inner cylinder 31, is preferably closed at the bottom and open at the top, while outer cylinder 32 is preferably open at the bottom and closed at the top, thereby forming annular inner channel 33 for excitation and transportation of plasma 14. Preferably, the cross-section of the annular inner channel 33 gradually changes from annular to circular from top to bottom. A bottom circumference 18 of FIG. 2A of the inner cylinder 31 acts as a baffle for changing the flow of charged and neutral particles in an axial part of the plasma source.

Such a preferred embodiment of the reactor offers several advantages over conventional approaches. First, active plasma volume is minimized, thus increasing specific power deposition. Second, back streaming of the reaction products into the plasma is minimized. Third, uniformity of neutral species velocities are improved. Fourth, neutral depletion effect caused by ion pumping is minimized, thus providing radial uniformity of neutral species at the outlet of the plasma source.

As shown in FIGS. 1, 2A, and 2B, the circumferential space between the reactor 3 and the wall of a plasma source chamber 15 is preferably used for the installation of the inductor coil 4. Under low pressures, exciting the discharge in this space is possible and sputtering of the inductor coil 4 may occur. However, process pressures as low as 1–10 mTorr are desirable in many cases. This sputtering problem is preferably solved by introducing a shutter 9, as shown in FIGS. 1 and 2A. The shutter 9 is positioned between the plasma source chamber 1 and the process chamber 2 to open (shown in FIG. 1) or close (shown in FIG. 2A) an opening 19. When the shutter 9 is opened, the entire volume of the plasma source between the plasma source chamber 1 and the plasma reactor 3 is evacuated. When the shutter 9 is closed, a flow of inert gas passes through the gap between the plasma reactor 3 and the wall of the plasma source chamber 15, thus providing a pressure that is sufficiently high to eliminate sputtering of the inductor coil 4 while the pressure in the plasma reactor 3 is the same as in the process chamber 2. The shutter 9 also prevents back streaming of the reaction products to the proximity of the inductor coil 4.

Figure 3:
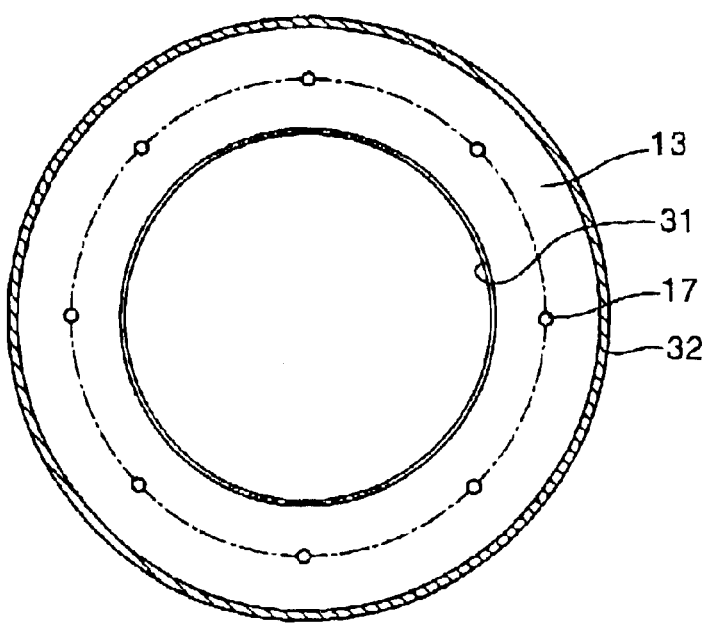
FIG. 3 illustrates a plan view of a gas distributing plate installed in the annular channel of the ICP apparatus shown in FIG. 1.

In the preferred embodiment, azimuthal uniformity of gas flow of the plasma in the plasma source chamber 1 is provided by means of two gas distributing plates 13. The gas distributing plates 13 are spaced apart from each other in the annular inner channel 33 of the plasma reactor 3 and a schematic configuration thereof is shown in FIG. 3. FIG. 3 illustrates an annular plate 13 having a number of symmetrically distributed orifices 17. The gas distributing plates 13 along with the shutter 9 provide a pressure distribution that prevents back streaming of the reaction products into the plasma source and the gas manifold 20.

Referring to FIG. 2A, the relationship of the various pressures is P<P2<P1<P3, where P is a pressure in the process chamber 2 and P3 is a pressure in the inductor area. Since the wafer susceptor in the present embodiment is preferably electrically floating, it may be connected to an auxiliary power supply. This auxiliary power supply must provide either a low frequency voltage or plurality of bipolar direct current (DC) pulses at a voltage sufficient to perform controlled excitation and ionization of the gas in the proximity of the wafer. In most cases, this greatly facilitates the deposition process over conventional remote plasma CVDs, which are too slow. Further, by pulsing of both a high power supply, which is applied to the high-density plasma source, and the low power supply, which is applied to the wafer susceptor, it is possible to provide modified radical-assisted sequential deposition wherein high power pulses are preferably synchronized with a series of discrete supplies of one reagent supply (e.g., $O_2$) and low power pulses are preferably synchronized with a series of discrete supplies of the other reagent (e.g., $SiH_4$).

Figure 4:
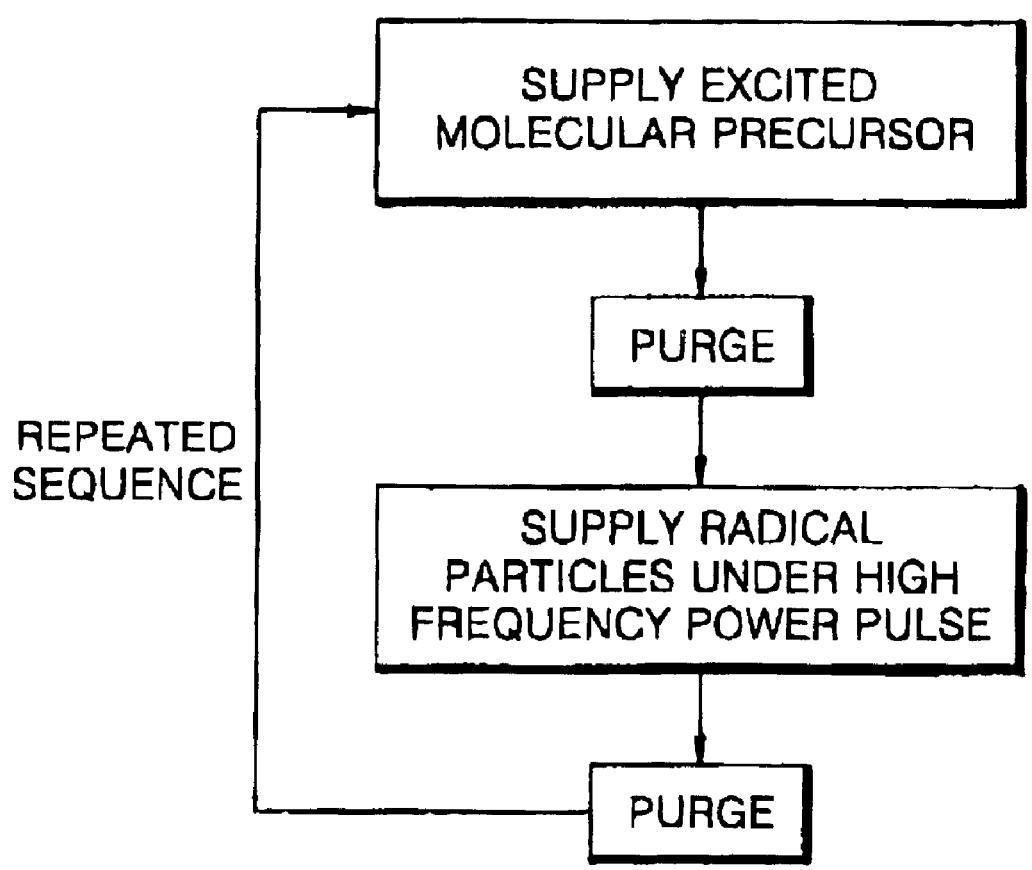
FIG. 4 is a flowchart of a modified radical-assisted sequential (RAS) deposition process according to an embodiment of the present invention.

FIG. 4 is a flowchart of a modified radical assisted sequential deposition process according to an embodiment of the present invention. This process differs from a conventional method in that it presents a repeated sequence of supplying an excited molecular precursor, purging the precursor, supplying radical particles under a high frequency power pulse, and then purging the radical particles.

As described above, actual plasma volume is minimized, and thus specific power deposition is increased. Additionally, back streaming of reaction products into the plasma is minimized, and an improved uniformity of neutral species velocities is provided. Further, a neutral depletion effect caused by ion pumping is minimized, and thus radial uniformity of neutral species is provided at the outlet of a plasma source.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An inductively coupled plasma apparatus comprising:
   a process chamber having a wafer susceptor on which a substrate is installed;
   a top plasma source chamber which is installed on the process chamber;
   a reactor, which is installed in the top plasma source chamber, having a channel through which a gas flows, wherein the reactor supplies plasma reaction products to the process chamber;
   an inductor, having two ends, is installed between the top plasma source chamber and the reactor and is wound around the reactor;
   an opening positioned within a circumferential space wherein the inductor is installed, the opening selectively providing flow communication between the top plasma source chamber and the process chamber; and
   a shutter operable to open and close the opening.

2. The inductively coupled plasma apparatus as claimed in claim 1, wherein the reactor comprises:
   an inner cylinder;
   an outer cylinder which surrounds the inner cylinder; and
   an annular channel which is positioned between the inner cylinder and the outer cylinder,
   wherein a top of the annular channel is connected to a gas manifold outside the top plasma source chamber.

3. The inductively coupled plasma apparatus as claimed in claim 2, wherein the bottom of the inner cylinder narrows so that a bottom of the annular channel between the inner cylinder and the outer cylinder is changed into a circular shape.

4. The inductively coupled plasma apparatus as claimed in claim 2, further comprising:
   a gas distributing plate having a plurality of orifices, which is installed in the annular channel.

5. The inductively coupled plasma apparatus as claimed in claim 3, further comprising:
   a gas distributing plate having a plurality of orifices, which is installed in the annular channel.

6. The inductively coupled plasma apparatus as claimed in claim 2, further comprising a plurality of gas distributing plates spaced apart from each other in the annular channel, each one of the plurality of gas distributing plates having a plurality of orifices.

7. The inductively coupled plasma apparatus as claimed in claim 3, further comprising a plurality of gas distributing plates spaced apart from each other in the annular channel, each one of the plurality of gas distributing plates having a plurality of orifices.

8. The inductively coupled plasma apparatus as claimed in claim 1, wherein the wafer susceptor is electrically floating in the process chamber.

9. The inductively coupled plasma apparatus as claimed in claim 8, wherein the wafer susceptor is supported by a ceramic vacuum break in the process chamber.

10. The inductively coupled plasma apparatus as claimed in claim 2, wherein the wafer susceptor is electrically floating in the process chamber.

11. The inductively coupled plasma apparatus as claimed in claim 10, wherein the wafer susceptor is supported by a ceramic vacuum break in the process chamber.

12. The inductively coupled plasma apparatus as claimed in claim 1, further comprising:
   a purge inert gas being supplied to the circumferential space in which the inductor is installed.

13. The inductively coupled plasma apparatus as claimed in claim 1, wherein a length of the inductor is equal to m×¼ wavelengths of a frequency of an applied electromagnetic field, where m is an integer.

14. The inductively coupled plasma apparatus as claimed in claim 13, wherein a high frequency power is supplied to a turn of the inductor between the two ends of the inductor, and wherein the two ends of the inductor are either grounded or floating.

15. The inductively coupled plasma apparatus as claimed in claim 1, wherein a high frequency electromagnetic field and a low frequency electromagnetic field are pulsed periodically according to a given sequence.

16. The inductively coupled plasma apparatus as claimed in claim 13, wherein a high frequency electromagnetic field and low frequency electromagnetic field are pulsed periodically according to a given sequence.

17. The inductively coupled plasma apparatus as claimed in claim 1, wherein a plurality of bipolar pulses of a DC voltage are applied to the substrate via the wafer susceptor.

18. The inductively coupled plasma apparatus as claimed in claim 13, wherein a plurality of bipolar pulses of a DC voltage are applied to the substrate via the wafer susceptor.

19. The inductively coupled plasma apparatus as claimed in claim 15, wherein the pulses of the electromagnetic field are synchronized with a series of discrete supplies of a first and a second gas, whereby the first and the second gases are supplied sequentially to provide a modified radical-assisted sequential deposition process.

20. The inductively coupled plasma apparatus as claimed in claim 16, wherein the pulses of the electromagnetic field are synchronized with a series of discrete supplies of a first and a second gas, whereby the first and the second gases are supplied sequentially to provide a modified radical-assisted sequential deposition process.

21. The inductively coupled plasma apparatus as claimed in claim 17, wherein the pulses of the electromagnetic field are synchronized with a series of discrete supplies of a first and a second gas, whereby the first and the second gases are supplied sequentially to provide a modified radical-assisted sequential deposition process.

22. The inductively coupled plasma apparatus as claimed in claim 18, wherein the pulses of the electromagnetic field are synchronized with a series of discrete supplies of a first and a second gas, whereby the first and the second gases are supplied sequentially to provide a modified radical-assisted sequential deposition process.

* * * * *